United States Patent [19]

De Fornel et al.

[11] Patent Number: 5,340,981
[45] Date of Patent: Aug. 23, 1994

[54] REAR FIELD REFLECTION MICROSCOPY PROCESS AND APPARATUS

[75] Inventors: Frederique De Fornel; Jean-Pierre Goudonnet, both of Dijon; Nathalie Cerre, Nevers, all of France

[73] Assignee: STM (Societe D'Investissement Dans La Microscopie) S.A., Auxerre, France

[21] Appl. No.: 835,980

[22] PCT Filed: Aug. 27, 1990

[86] PCT No.: PCT/FR90/00632
§ 371 Date: Apr. 27, 1992
§ 102(e) Date: Apr. 27, 1992

[87] PCT Pub. No.: WO91/03757
PCT Pub. Date: Mar. 21, 1991

[30] Foreign Application Priority Data

Aug. 28, 1989 [FR] France ................. 89 11297

[51] Int. Cl.$^5$ .............................. H01J 5/16
[52] U.S. Cl. ..................... 250/227.2; 250/234; 359/368
[58] Field of Search ............ 250/227.20, 216, 234; 359/356, 368

[56] References Cited

U.S. PATENT DOCUMENTS

| | | |
|---|---|---|
| 4,684,206 | 8/1987 | Bednorz et al. |
| 4,725,727 | 2/1988 | Harder et al. .......... 250/227.28 |
| 4,917,462 | 4/1990 | Lewis et al. .......... 250/216 |
| 5,105,305 | 4/1992 | Betzig et al. .......... 359/368 |

FOREIGN PATENT DOCUMENTS

| | | |
|---|---|---|
| 0112401 | 7/1984 | European Pat. Off. |
| 0112402 | 7/1984 | European Pat. Off. |
| 0185782 | 7/1986 | European Pat. Off. |
| 0283256 | 9/1988 | European Pat. Off. |

OTHER PUBLICATIONS

M. V. Iravani, *Electronics Letters*. "Fibre-Optic Scanning Differential Interference Constrast Optical Microscope," vol. 22, No. 2. Jan. 16, 1986. pp. 103–105.

*Primary Examiner*—Edward P. Westin
*Assistant Examiner*—T. Davenport
*Attorney, Agent, or Firm*—Sandler Greenblum & Bernstein

[57] ABSTRACT

Reflection microscopy process and apparatus for examining a surface which enable the injection of highly coherent electromagnetic wave, such as produced by a laser, in a waveguide whose outlet surface is flat and transparent, at least in the zone where propagation mode of the waveguide is emitted. The outlet surface is positioned above the surface to be examined at a chosen distance so that the coupling coefficient between the particular mode of propagation of waveguide and the propagation mode of the electric field of the wave reflected by the surface and guided in return by the waveguide, depends in an essentially exponential way on the distance or can be compared, at least locally, with an exponential variation function, or is rapidly decreasing, depending on the distance, and the surface is scanned with the waveguide. In particular, the field of the invention concerns scanning microscopy, by purely optical elements and with nanometric resolution. The invention can also be used for optical control of the distance between a given surface and an instrument to be moved above this surface, and, in particular, any instrument of the type used for microlithography of integrated circuits.

22 Claims, 3 Drawing Sheets

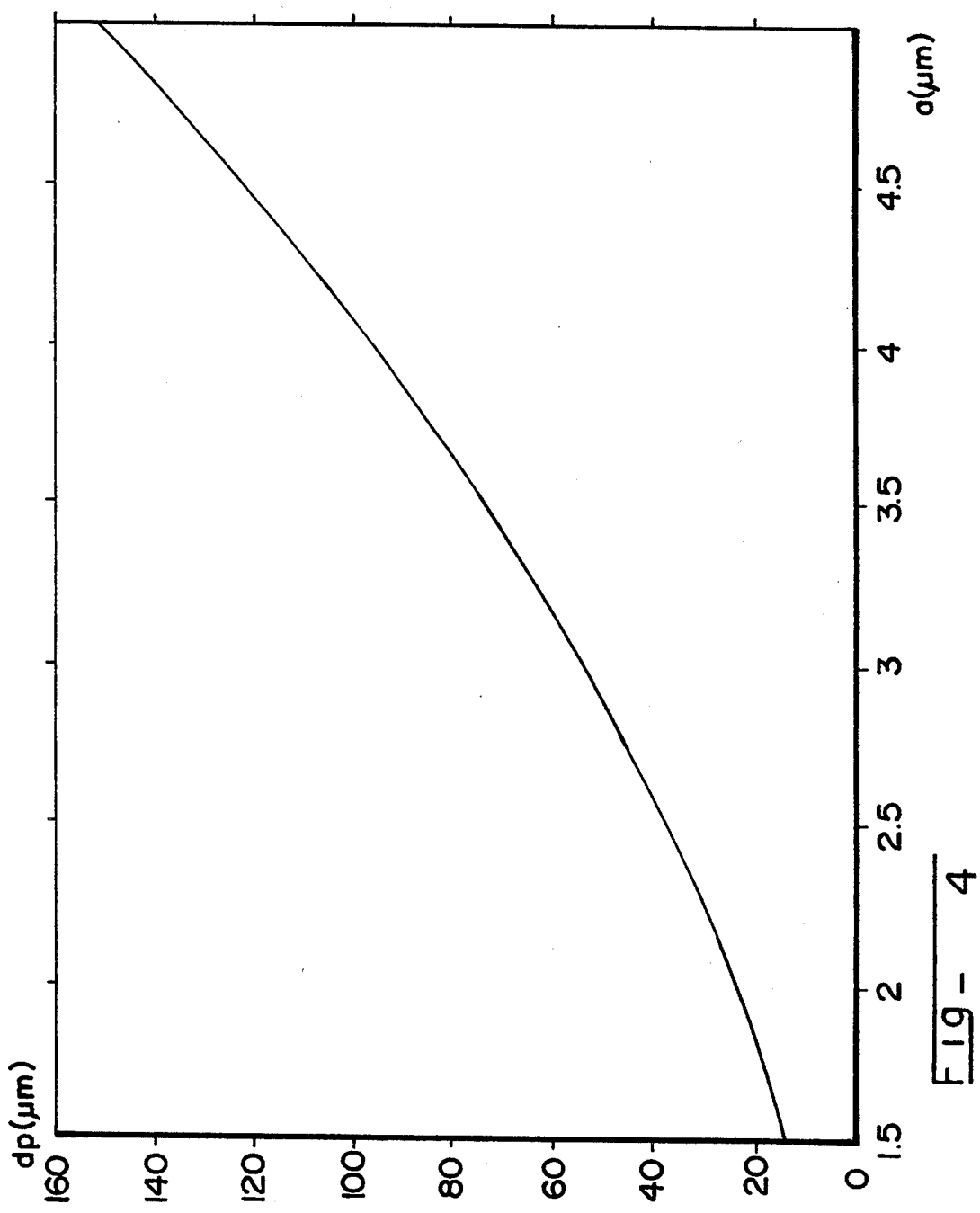

REAR FIELD REFLECTION MICROSCOPY PROCESS AND APPARATUS

BACKGROUND OF THE INVENTION

Field of the Invention

The invention concerns a near field reflection microscopy process and microscope using a waveguide of the optic fibre type as a probe of this field.

Traditional near field microscopy takes advantage of the particular structure of an electromagnetic wave in the neighborhood of a diameter opening smaller (and up to ten times larger) than its wavelength. The neighborhood should here be understood as being the area called "near field" which is situated at a distance from the opening smaller than the wave length. In this area, the wave intensity rapidly decreases until it reaches the value of the intensity within the area called "far field" which can be calculated by a known way, by application of Maxwell equations.

This extremely rapid decrease of the intensity depending on the distance from the opening enables to survey with accuracy the topography of the surface from where the light is emitted, or re-emitted, each variation of intensity measured by appropriate means corresponding to a distance variation.

A number of devices are known which operate according to this principle, both in transmission and in reflection. For example, European patent EP-112 401, filed 27th Dec. 1982 by International Business Machines Corporation, is directed to overcoming the problem of obtaining a small diameter opening, typically smaller than the micrometer, usable in an optical near field microscope. In an embodiment described in this document, the opening receives the light transmitted through a sample to be analyzed, with the opening being kept at an appropriate distance by a traditional means such as an electronic probe measuring tunneling current of electrons.

The use of such an electronic probe nevertheless makes it necessary to metallize the sample to be analyzed, the submicronic opening being already metallized, since it is limited by a thick layer of metal, opaque to the measuring electromagnetic wave.

This double metallization of the sample and the optical probe composed by the submicronic opening, has serious inconveniences.

Indeed, the metallization of organic samples, or more generally dielectrical, may form an obstacle for the observation of certain phenomenae, namely dynamic or living phenomenae. Moreover, this metallization may be heterogeneous or hide small scale structures by overlapping. In addition, in the case of discontinuity of the superficial conductor layer, the control of the distance to the opening is no longer assured, which leads to a topographic aberration.

Finally, it was noted that the metallic walls of the submicronic opening and the metallized surface of the sample make a resonant cavity causing interferences which modulate the intensity measured behind this opening and perturbs the measure.

In addition, the opening of a submicronic diameter is the main difficulty in realizing this kind of microscope, and limits its development. Indeed, the repetitive manufacture of a submicronic opening, especially for a near field transmission microscope is particularly difficult to put into operation and is the object of a solution described in European patent EP112 402, filed on 27th Dec. 1982 by International Business Machines Corporation. The diameters of the openings realized by the process described in this document vary between 10 to 500 nanometers. The horizontal resolution of a near field microscope equipped with such an opening then depends directly on its diameter and on its distance from the sample—the resolution is in the region of the greater of these two quantities.

The same difficulties of implementation exist for the near field reflection microscope. For this type of microscope, specific optical probes have been developed in emission and reception, and namely that described in European patent EP185 782, filed 28th Dec. 1984 in the name of International Business Machines Corporation. In this document, is described a compound wave guide, the terminal section of which is annular, so as to present:

a first submicronic opening, delimited by an opaque metal layer operating in emission, and a transparent peripheral ring, delimited by the first opaque layer and a second opaque metal layer operating in reception.

The measurement of the reflected light is carried out in this way through a planar peripheral waveguide composed by the transparent peripheral ring; this configuration is unfavorable for a reliable measurement insofar as such a planar structure will inevitably introduce undesirable electromagnetic propagation modes.

Finally, other known microscopic techniques, and in particular optical microscopy by phase contrast—such as described for example in an article published in the magazine Electronics Letters, vol. 22, No. 2, January, 1986, pages 103–105, called "Fibre-optic scanning differential interference contrast optical microscope", written by Mr. VAEZ IRAVANI,—or again the scanning optical microscopy—such as described in the application for a European patent EP-283 256 filed 16th Mar. 1988 in the name of TEKTRONIX Inc, do not use the near field phenomenon and are consequently limited in resolution by the far field diffraction phenomenae.

SUMMARY OF THE INVENTION

The object of this invention is to remedy all these inconveniences by proposing a reflection microscopy process of a surface including the following operations:

the injection of a highly coherent electromagnetic wave, for example produced by a laser, in a waveguide whose outlet surface is flat and transparent, at least in the zone where propagation mode of the waveguide is emitted;

positioning of the outlet surface above the surface to be examined at a chosen distance so that the coupling coefficient between the particular mode of propagation of the waveguide and the propagation mode of the electric field of the wave reflected by the surface and guided in return by this same waveguide, depends in an essentially exponential way on the distance or can be compared, at least locally, with an expontential variation function, or rapidly decreasing function, depending on the distance.

Scanning of the surface using the waveguide.

The present invention thus shows a new phenomenon allowing to obtain variations of reflectivity of a reflecting surface as well as its topography. The terminology "coupled mode wave" will be used to describe the wave reflected by the surface and guided in return by the waveguide. Indeed, the phenomenon exploited in the invention consists in a coupling of modes between the particular propagation mode of the waveguide and a reflecting wave having a modal structure since it was previously emitted by the waveguide, this structure being slightly "spread out" because of the bidirectional propagation of the wave within the interval separating the end of the waveguide from the reflecting surface to be examined.

Moreover, because the intensity of the coupled mode wave directly depends on the above mentioned coupling coefficient, the measurement of this intensity enables to measure the evolution of this coefficient. According to the invention, the exploitation in optical image formation of such a phenomenon is of two kinds, namely:

according to a first exploitation mode, the end of the waveguide is maintained at a practically constant level above the surface to be studied, whilst the intensity of the coupled mode wave is measured, i.e., the variations of the coupling coefficient between the main propagation mode of the waveguide and the propagation mode of the electrical field of the wave reflected by the surface. This measurement is then interpreted as resulting from a variation of distance or reflectivity of the surface, by theoretical or data processing inversion of the rather exponential dependence between the intensity and the distance between the surface to be studied and the end of the waveguide.

according to a second exploitation mode, an action is made on the vertical position of the end of the waveguide, so as to maintain constant the intensity of the coupled mode wave. This reaction could well be put into operation by means of a feed-back system presenting a large pass band, which would enable to raise with great sensitivity, and therefore a high resolution, the vertical movements of the end of the waveguide which are directly representative of the topography and/or the reflectivity of the surface to be studied (considering that the reflectivity of a a material depends on its optical index, the spectroscopic measurements of this surface are also possible).

The fields of application of the near field reflection microscopy process according to the invention are thus quite comparable with those of the scanning tunneling microscope, now well known. Moreover, the simplicity of putting this process into operation is great, since it is not necessary to make a submicronic diameter opening, nor to metallize the waveguide or the sample to be studied.

A simple fiber optic (optical fiber) can thus be used, for example a monomode step-index fiber, as waveguide, such a fiber being able to be used in three main non-limitative ways, i.e.:

a) the fiber is broken at its end, so as to present in regard to the reflecting surface to be studied, a flat face which is almost perpendicular to the longitudinal propagation axis of an electromagnetic wave in the core of the fiber; it has been shown that this is the most favorable case for obtaining a good resolution (case where the reduction of the coupled mode wave intensity is the quickest, depending on the distance). Moreover, in this situation, it has been shown that it might be interesting to position the flat fiber optic output face above the surface to be examined, following a direction that is almost orthogonal to this surface, under conditions such that a constructive interference phenomenon occurs between the coupled mode wave and the wave reflected within this same fiber on its flat output face; this interference phenomenon, possible because of coherence of the waves of the same wavelength, can be avoided by inserting an index gel between the surface to be examined and the flat output face of the fiber (for example, for a silicium fiber, an index gel showing an optical index equal to 1. 458). To the contrary, when in the optimal conditions of sensitivity to the above interference phenomenon, it is favourable to act on the vertical position of the flat output face of the fiber so as to maintain constant the intensity of the electromagnetic wave resulting from this interference phenomenon, even when the intensity normally presents a sinusoidal modulation with a constant interfringe distance; to do this, an accurate wide band feed-back is useful so as to avoid any abrupt variation in the collected intensity, due to the step from a half period of the modulation to another. The interfringe distance giving this period is simply equal to the ratio of the wavelength by twice the value of the index of the intermediate medium between the output face of the fiber optics and the reflecting surface to be examined. This interfringe distance, for optical waves, is weak (in the range of a few hundred nanometers) and allows to substantially improve the resolution of the microscopy according to this invention.

In this respect, and still within this first use of a fiber optic as waveguide acting as a probe of the near field created by coupling reflection modes, two cases can be distinguished.

depending on whether the reaction on the vertical position of the flat output face of the fiber is carried out in attractive mode, i.e., the intensity of the electromagnetic wave resulting from the interference phenomenon between the coupled mode wave and the wave reflected in the fiber by the output face is controlled in the downward part of a single period of the sinusoidal modulation of the intensity, or depending on whether the reaction on the vertical position of the flat output face of the fiber is carried out in repulsive mode, i.e., that the intensity of the electromagnetic wave resulting from the same interference phenomenon is controlled in the descending part of a single period of the sinusoidal modulation.

b) in a second possible use of a monomode fiber optic as waveguide, the fiber again has at the end, a flat face almost perpendicular to the average direction of the propagation of the light in the fiber. This flat face is positioned above the surface to be examined according to a direction making a substantial angle with the surface, so as to avoid the previously described constructive interference phenomenon from occuring between the coupled mode wave and the mode reflected in the fiber by its flat output face or, at least, so as to avoid that this interference phenomenon be measurable (which is realized if the sinusoidal modulation, superposed to the intensity of the essentially exponential reduction coupled mode wave intensity, is of a low level unable to be seen by the vertical position control of the flat output face of the fiber).

c) in a third possible use of the monomode optic fiber as waveguide, a flat face is at the end of this fiber makes a substantial angle with the average direction of the propagation of the light in the fiber. This case is similar to case b) above, in that no measurable constructive interference phenomenon can occur between the coupled mode wave and the wave reflected in this same fiber on its flat output face.

Of course, the three cases of use a) to c) are not limitative and other structures can be considered on the end of a monomode fiber optic used according to the invention.

BRIEF DESCRIPTION OF THE DRAWINGS

Other characteristics and advantages of the microscope according to a the invention will appear from the following description of a preferred embodiment given as a non-limitative example of a near field reflection microscope in reference to the attached drawings in which:

FIG. 4 shows the embodiment of the penetration depth of the electromagnetic wave used in an alternative embodiment depending on the radius of the fiber optic core used as waveguide.

DETAILED DESCRIPTION OF THE PREFERRED EMBODIMENTS

Figure 1:
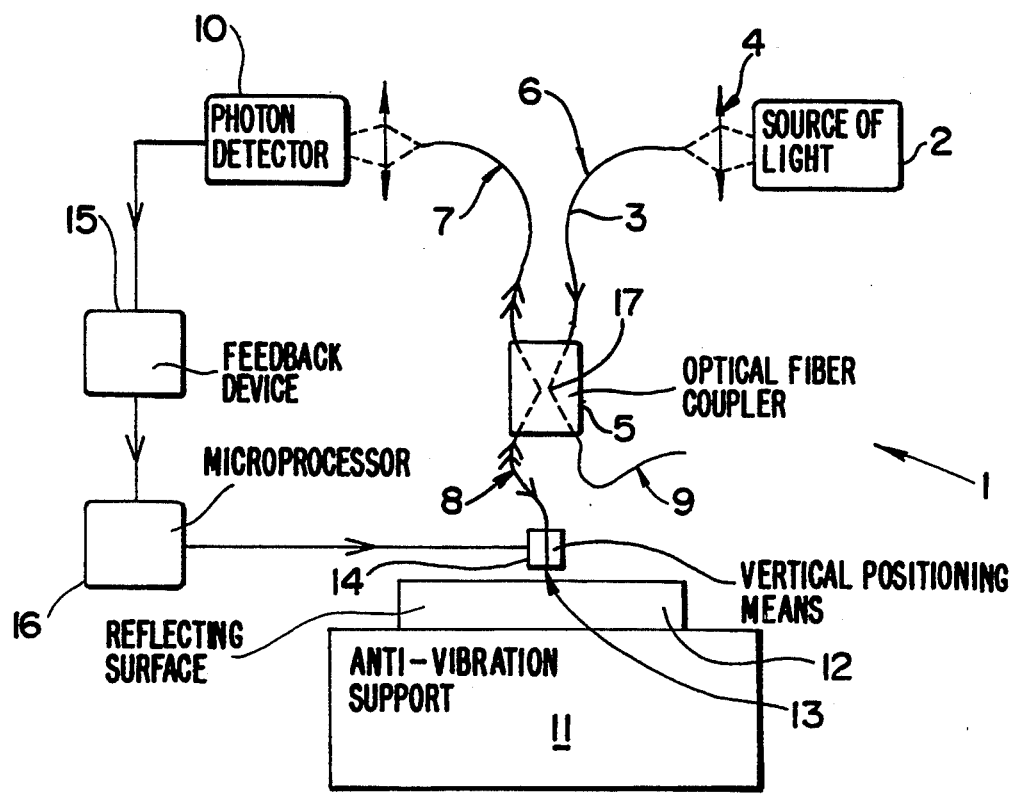
FIG. 1 is a very schematic view of a microscope according to a preferred embodiment of the invention realization.

According to FIG. 1, and according to a preferred embodiment of the invention a near field microscope 1 is mainly composed of:

a source of light 2, such that a laser cavity, or an electroluminescent diode (for example with narrow band) coupled to a fiber 3 by appropriate optical means 4. Optical means 4 can, for example, be a simple short focus converging lens of the highly magnifying type for a traditional optical microscope.

an optical fiber coupler 5 with fiber optics, realized, for example by a fusion/stretching process, this coupler 5 including two input transmission channels 6 and 7 and two output transmission channels 8 and 9. The fiber optic 3 can preferably be that composing the channel 6 of the coupler 5. In this way, the quality of the electromagnetic wave emitted by the source 2 is maintained over its whole way in avoiding the fiber/fiber interfaces.

a photon detector 10, such as, for example, a photoelectron multiplier, coupled to the channel 7 of the fiber coupler 5. This detector 10 receives and measures the light being propagated in the coupler 5 in the opposite direction to that of the emission.

a traditional anti-vibration support 11 possibly associated with a traditional scanning means. This means of scanning, of a typically micrometric accuracy, enables to laterally scan the reflecting surface 12 to be studied by the end 13 of one of the channels 8 or 9 of the coupler 5, for example, channel 8 (in this case, channel 9 is not used or is used for carrying out a reference measurement of the intensity of the wave emitted by source 2).

a traditional vertical positioning means 14 by the end 13 of the channel 8 in relation with the reflecting surface 12. This vertical positioning means 14 can also be used for the "fine" lateral displacement, i.e., submicrometric, of the end 13. It can be connected by a feedback device 15 to a micro-processor 16 controlling the signal received by the detector 10; this signal represents the intensity of the light being propagated in return in the coupler 5.

It should be noted that the positioning means 14 can be a device including for example a piezoelectric tube or a set of piezoelectric crystals arranged in an appropriate manner (of the type known in particular under the name of "bimorphs").

Under these conditions, the use of the microscope 1 can be summarized as follows. The light coming from source 2 is propagated through the fiber 3 composing the channel 6 of the coupler 5, to the coupling area 17 of the coupler 5, where the fusion/stretching of the fibers composing the coupler 5 is carried out. A known part of the light (50% for example) is then propagated into the output transmission channel 8 of the coupler 5, up to the end 13 of the channel 8.

Figure 2:
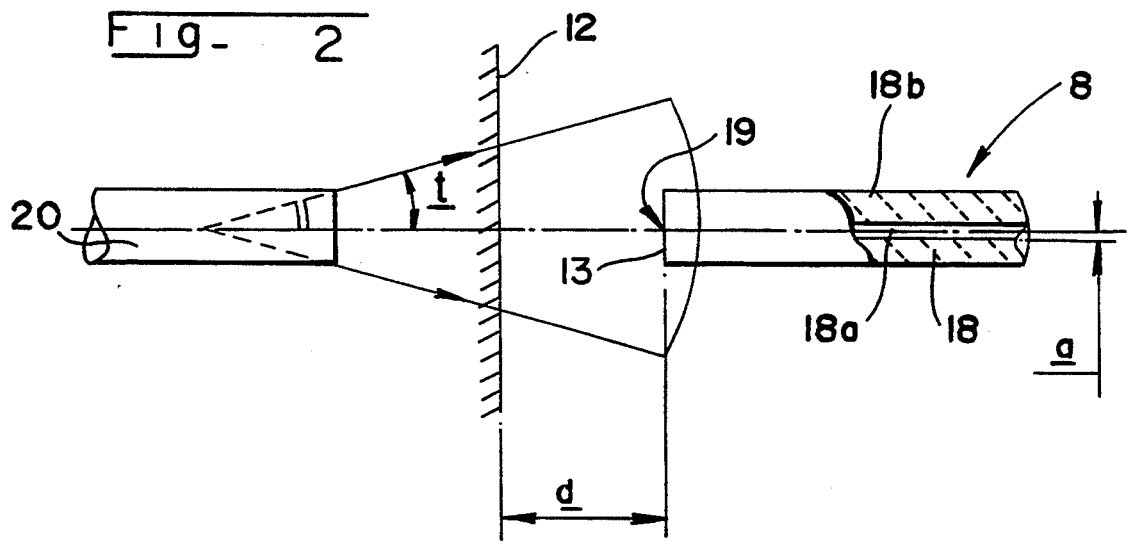
FIG. 2 is a detailed view of the end of the waveguide used preferentially in the invention, in regard to the surface to be studied and showing in particular the coupling of the wave reflected in the waveguide.

According to FIG. 2, channel 8 is an optical step-index fiber 18, with $n_0$ the real index of the core 18a and $n_1$, the index of the cladding 18b. The end 13 of this fiber 18 appears as a flat face 19 almost perpendicular to the direction in which the light is propagated into the fiber 18. The light is then emitted towards the reflecting surface 12, the topography and the composition of which are unknown, then it reflects and comes back in the direction of the end 13 where it is coupled with the main propagated mode of fiber 18. Here, it was chosen to take into account tile case described in a) discussed above, i.e., that operating conditions are such that a constructive interference phenomenon may occur between the coupled mode wave and the wave reflected directly on tile flat face 19 within the fiber 18, but first of all we shall describe the mode coupling phenomenon according to the invention, without taking into account this interference phenomenon which can easily be eliminated by means of an appropriate index gel, or by sloping the flat surface 19 in relation to the surface to be studied (b) discussed above.

The light propagating in return in channel 8 is thus modulated by the reflecting surface 12. It then crosses the coupling area 17 of the coupler 5 and a part of the intensity of this light (50% for example) passes into channel 7 of the coupler 5 where it is detected at tile end by the detector 10.

The physical mechanisms used will be better understood if one considers, according to FIG. 2, the structure of the electromagnetic waves emitted and reflected within the "near field" area located between the flat face 19 of the end 13 of the fiber 18 and the reflecting face 12.

It is shown through the resolution of the Maxwell equations combined with appropriate limit conditions that alone varies the radial component of the electrical field of an electromagnetic wave propagating within fiber 18. This radial component is written as follows:

-equation (i): $J_0(ur/a)$ inside the core 18a of the radius $a$ of the fiber 18, -equation (ii): $(J_0(u)/K_0(v))*K_0(vr/a)$ outside the core 18a and inside the cladding 18b of the fiber 18, with r the radius, u and v verifying the specific equations functions of a, of the indexes 18a and of the cladding 18b, and of propagation coefficients of the electromagnetic wave (wave vectors). The functions $J_0$ and $K_0$ are functions of Bessel of the order of 0.

The light is emitted at the end of the fiber 18 within a numerical opening cone which depends on the step index ($n_1-n_0$) of the fiber 18. The light reflected by the reflecting surface 12 can be considered as coming from a virtual fiber 20 symmetrical to the fiber 18 in relation to the plane delimited by the surface 12. In FIG. 2, the reflected light is shown as coming from the virtual fiber 20, with an opening angle t. Also, d shows the distance separating the reflecting surface 12 of the flat surface 19 of the end 13 of the fiber 18.

In these hypotheses, alone varies the radial component of the electrical field of the reflected electromagnetic wave coming from the virtual fiber 20, this variation being written in the same way as the radial variation of the incident wave coming from fiber 18; everything then occurs as though the virtual fiber 20 had a core of radius equal to a/alpha, alpha being a geometrical factor taking into account the divergence in the air of the propagation mode of the reflected wave. It is therefore necessary to replace a by a/alpha in the equations (i) and (ii) to find the expressions of the radial component of the electrical field of the reflected wave.

Figure 3:
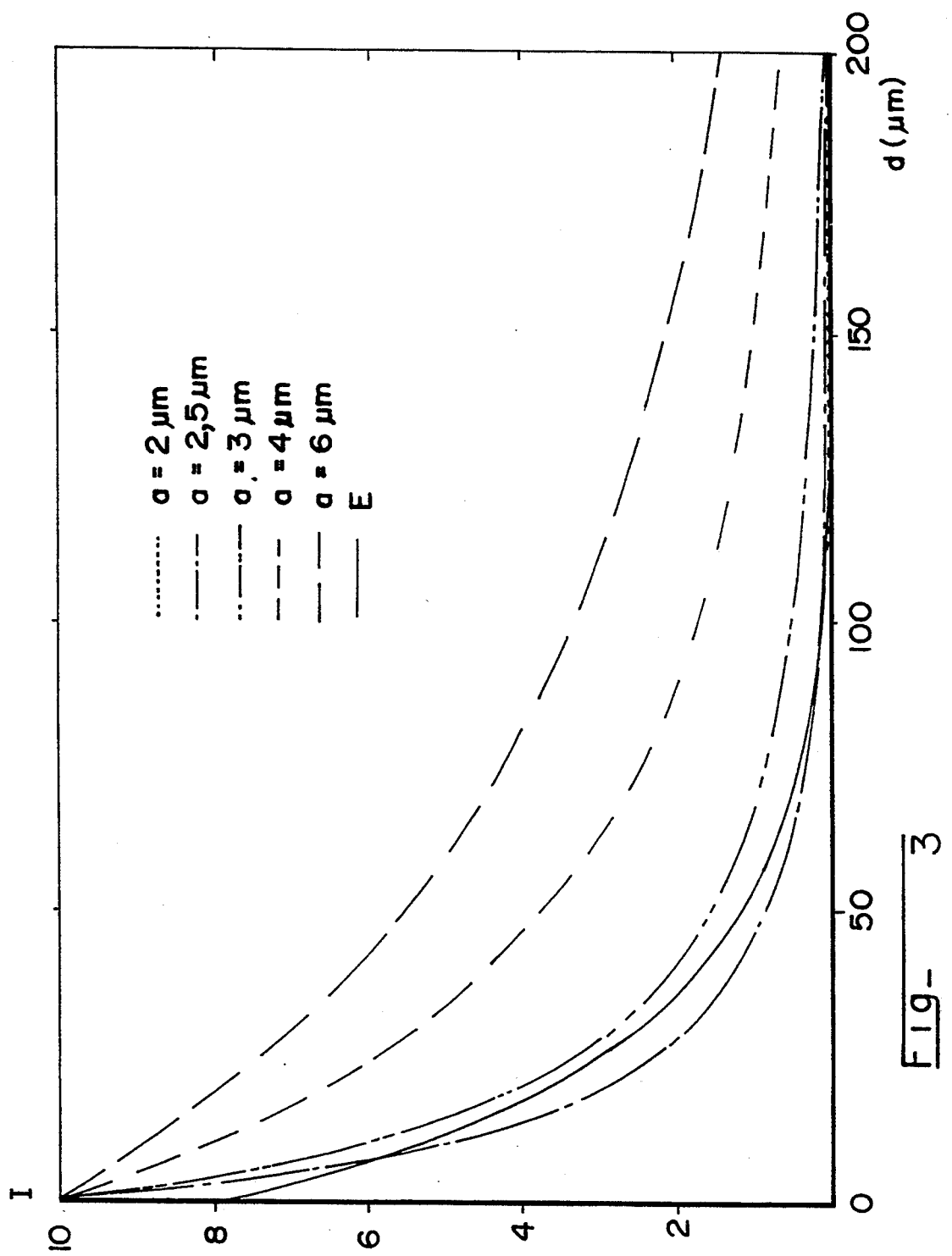
FIG. 3 shows a theoretical curve group compared to an experimental curve showing the dependence between the intensity collected in the waveguide and the distance between the surface to be studied and the output face of the guide.

The intensity collected by the detector 10 is proportional to the coupling coefficient between the propagation mode of the wave reflected in the air and the main propagation mode of the fiber 18, the resulting coupled wave here being called again "coupled mode wave"; the value of the coupling coefficient is determined, for example, numerically by calculating the recovery integral of the two modes. By taking as additional hypothesis the case of a constant numerical opening, which is quite possible to realize, a curve group was obtained, represented and referenced in FIG. 3, showing the dependance existing between the intensity of the coupled mode wave collected on the detector 10 and the distance d.

There is a very rapid, essentially exponential, decrease of this intensity depending on the distance d.

This property is comparable to the very rapid decreasing of the intensity in the neighbourhood of an opening with a diameter smaller than the wave length which is used in a traditional near field microscope: in this case, the decrease depends however on the coupling of three evanescent waves, one created in incidence by the opening, the second reflected by the surface to be examined and the third created in reflection by this same opening.

It should be noted that the "near field" of a fiber used in the conditions of the invention is more "spread out" than the near field of a submicronic opening and it is noted in particular, that the distance d can be very much higher than the wavelength of the electromagnetic wave emitted by source 2.

The applications of a rapid decrease, almost entirely exponential, of the intensity are the same in both cases, i.e., concerning the spectroscopic study and the topographic study of the surfaces, with an improved resolution of at least one scale measurement in relation to traditional optic microscopy (which is limited by diffraction).

It is usual to call $d_p$ the penetration depth of the "measurement wave"; it characterizes the vertical resolution it is possible to obtain with the microscope used.

a1) For the traditional near field microscope, it has been shown that this resolution is situated within a range varying from a few nanometers to a few hundred micrometers.

a2) In the case of microscope 1 according to the invention, shown in FIG. 4 is the variation of the quantity $d_p$ depending on the radius a of the core 18a of the fiber optic 18, composing channel 8, and using an optic probe for this microscope 1 (the light source 2 was a Helium-Neon laser emitting a wavelength of 632 nanometers and the numerical opening was constant and equal to 0.23). It should be noted that the penetration depth $d_p$ considerably decreases with the radius a of the core 18a of the fiber optic 18. This theoretical curve was experimentally verified in some of its points, and, in particular, for a fiber 18 with a radius a, a core equal to 2.5 micrometers and a cladding diameter equal to 125 micrometers; for such a fiber 18, $d_p$ is equal to a value of about 40 micrometers. In FIG. 3, are also compared the group of theoretical curves with the curve E representing the experimental decrease of the intensity of the reflected wave under the conditions previously mentioned.

dp can be considerably reduced by acting on various parameters:

by reducing the wavelength of the wave emitted by the light source 2, the limit in wavelength being given by the existence of sources with a short wavelength and by the wavelength called "cut off wavelength" below which an electromagnetic radiation cannot propagate in fiber 18 (at present 180 nanometers for a silicium fibre).

by reducing the radius a of the core 18a of the fiber optic 18, for example, by drawing the end 13 of the fiber 18—it is possible to go as far as a core diameter of 500 nanometers without any problem, the resolution being reduced beyond that due to the "widening" of the specific propagation mode in the fiber 18 when the diameter of the core 18a is too small.

by varying in an appropriate way the geometrical characteristics of fiber 18, i.e., its indexes of each core and cladding, no and n1, so as to vary its numerical opening.

It can be estimated that the best vertical resolution it is possible to reach with microscope 1 according to the invention is near to 10 nanometers, for a silicium fiber 18 the core of which 18a has a diameter of 500 nanometers and for a "measurement" electromagnetic wave, with a wavelength equal to 205 nanometers, emitted by a coloring laser and doubled in frequency by means of non-linear cristals.

This resolution can be improved even more by at least one scale measurement if it is placed in the conditions of perception to the interference phenomenon already mentioned, since, even if the decrease in intensity is no longer exactly exponential, the spatial interfringe distance of the sinusoidal modulation of the intensity resulting from this phenomenon can reach very weak values (in the air, and for the wavelength of the Helium-Neon laser, the half period of oscillation equals approx. 150 nanometers, which enables to control the intensity with very great accuracy).

Having noted the simplicity of putting into operation microscope 1 in compliance with the invention, this resolution is the best resolution ever reached to date for the observation of surfaces difficult to metallize.

b) Lateral resolution b1) The lateral resolution of a traditional near field microscope is situated within a range varying from several tenths of nanometers to several millimeters. It is determined, as said above, by the size of the opening used as an optical probe and by the interference phenomenae occuring because of the excitation of the modes of the cavity composed by the metallized walls of the observed surface 12 and the hole delimited by an opaque conductor material.

b2) It was experimentally shown that the lateral resolution of microscope 1 according to the invention is very much smaller than the diameter 2a of the core 18a of the fiber optic 18 composing channel 8 of the coupler 5. In the case where this diameter is equal to 5 micrometers a reflecting surface 12 was observed, composed of an industrial diffraction grating with a step of 12 micrometers with a lateral resolution better than 500 nanometers (such a resolution has, moreover, been obtained through the exploitation of the direct recording of the intensity of the coupled mode wave, without posterior mathematic treatment usual in a similar case and aiming to extract from the measurement the noise or repetitive course errors). The wavelength of the "measurement wave" was 632 nanometers (Helium-Neon Laser).

It is therefore noted that, contrary to the traditional near field microscope, the lateral resolution is very much smaller than the diameter 2a of the core 18a of the fiber 18 used as an optical probe (this diameter is the equivalent of the diameter of the opening in the case of a traditional microscope).

Thus, a scale factor can reasonably be applied to these results, and, with the same source 2 and a fiber 18 tile core diameter of which is 500 nanometers, there can be obtained a lateral resolution better than 50 nanometers.

It is also noted the previously mentioned measurement was made in unfavorable experimental conditions for which the traditional means of vertical positioning 14 (FIG. 1) of the end 13 of the fiber 18 in relation to the reflecting surface 12 was not submitted to any feedback (for example, by means of the feedback device 15); but we know all the benefit that can be drawn from such a feedback insofar as accuracy is concerned, which enables the detector 10 to record a signal varying notably since the distance d is then maintained at a value corresponding to the high decrease area of the intensity of the wave reflected and transmitted by the coupler 5.

According to another embodiment of the near field microscope 1 object of this invention, tile vertical resolution (and also the lateral resolution) can be increased even more. In this embodiment, there is used as the optical probe, fiber optic 18 which is submitted to a chemical etching so as to taper the end 13; after this chemical etching (realized in a known way by means of an acid), the end of the fiber optic 18 is cut so as to present a flat face 19 almost perpendicular to the direction of propagation of the light within the fiber 18. The end 13 then appears as a tip and the cladding 18b surrounding the core 18a of the fiber optic 18 has become very thin. In this way, the main propagation mode within the fiber 18 can be very narrow; indeed, a wave propagating at the end 13 of the fiber optic 18 then "sees" three media:

the core 18a, of the optic index $n_0$ the cladding 18b of the optic index $n_1$, and the air, with an optic index equal to 1, which due to the fact that this index is much smaller than $n_1$ and $n_0$, reduces the "width" of the propagation mode in the fiber optic 18.

Throughout the above description, it is obvious that nowhere have been considered the modes of propagation in the fiber optic 18 other than the main propagation mode. This approach is entirely justified, since it is easy to make sure, in a known way, that certain modes do not propagate (which means that all the energy is propagated onto the main mode). In particular, the interface between the cladding 18b and the core 18a of the fiber optic 18 is responsible for the potential propagation of parasite modes called "cladding modes"; the operation called "emptying" of the fiber optic 18 enables to eliminate the propagation from it, a particularly efficient technique for doing so being to place on the optic fibers of channels 6 and 7 of the coupler 5 an "index liquid" (i.e., a liquid, the index of which is equal to that of the fiber cladding).

It is obvious from the previous description that the near field microscope 1 using as optic probe a waveguide such as, namely an optic fiber 18, easily resolves the inconveniencies linked with traditional near field microscopes and enables the spectroscopic observation and the topographic observation of reflecting surfaces 12 that are difficult to metallize. The spectroscopic observation is carried out by various techniques aiming to modulate the intensity of the coupled mode wave depending on the "spectroscopic parameter" wished to be extracted, for example, the wavelength. This observation indicates the nature of a reflecting surface 12, its topography, for example, being known from a first scanning of the surface 12 without modulating any parameter.

Microscope 1, according to the invention, can also be used as a distance probe similar to a distance probe using an electronic tunneling effect (technique derived from the electronic tunneling microscope). This purely optical sensor enables to avoid any metallization. The distance is then controlled, in this case, for values greater than in the case of an electronic tunneling, which procures other advantages, and, in particular, that of avoiding too great a proximity between the distance sensor and the surface 12 to be maintained at a distance—such a proximity is "dangerous" for the surface 12, since an abrupt variation, or a course error (i.e. a slope) can cause the physical coming into contact of the probe and the surface 12. In this application it is presumed that the surface is homogeneous and that alone a variation of the distance is responsible for an intensity variation of the coupled mode wave.

Considering that various modifications can be brought to the forms of realization described above without leaving the scope of the invention, it is understood that all the details contained in the description given above or represented in the attached drawings are given as an illustration of the invention and are therefore not limitative.

In particular any waveguide other than an fiber optic could be used, or else a non-monomode optic fiber can be used. It is also possible to imagine the use of another optic coupler than an fiber optic coupler realized by a fusion/stretching process.

The field of the invention is more particularly that of scanning microscopy, by purely optical means and with nanometric resolutions. The invention can also be used for the optical control of the distance between a given surface and an instrument to be moved above this surface, and, in particular, any instrument of the type used for the microlithography of integrated circuits.

We claim:

1. Process of near field reflection microscopy of a surface, comprising:

injecting a highly coherent electromagnetic wave through a waveguide, the waveguide having a flat outlet surface from which a propagation mode of the waveguide is emitted;

positioning the outlet surface a predetermined distance above a surface to be examined to obtain a coupling coefficient, between a propagation mode of the waveguide and an electromagnetic wave reflected by the surface and guided in return by the waveguide, which is substantially exponentially dependent on distance between the flat outlet surface and the surface to be examined; and scanning the surface with the waveguide.

2. The process of near field reflection microscopy according to claim 1, wherein, as the surface to be examined is scanned, the flat outlet surface of the waveguide above the surface to be examined is adjustably positioned to vary the distance separating the flat outlet surface and the surface to be examined to maintain the coupling coefficient constant.

3. The process of near field reflection microscopy according to claim 1, wherein, during the scanning of the surface to be examined, the flat outlet surface of the waveguide is maintained at a substantially constant level above the surface to be examined, and variations of the coupling coefficient are measured.

4. The process of near field reflection microscopy according to claim 2, wherein the waveguide comprises an optical fiber having a flat face which is substantially perpendicular to an average direction of propagation of light within the optical fiber, the flat face is positioned above the surface to be examined to follow a direction substantially orthogonal to the surface to be examined to obtain a constructive interference phenomenon between the wave reflected by the surface to be examined and guided in return by the optical fiber, and a wave reflected in the optical fiber on the flat face and by positioning of the flat face to maintain constant intensity of an electromagnetic wave resulting from superposition of the interference phenomenon on an average variation of the intensity which depends directly on the coupling coefficient.

5. The process of near field reflection microscopy according to claim 4, wherein the flat face of the optical fiber is positioned above the surface to be examined under mode conditions so that intensity of the electromagnetic wave resulting from superposition of the interference phenomenon on an average variation of the intensity can be controlled in a rising part by just one period of sinusoidal modulation of the intensity.

6. The process of near field reflection microscopy according to claim 4, wherein the flat face of the optical fiber is positioned above the surface to be examined under mode conditions so that intensity of the electromagnetic wave resulting from superposition of the interference phenomenon on an average variation of the intensity can be controlled in a descending part by just one period of sinusoidal modulation of the intensity.

7. The process of near field reflection microscopy according to claim 2, wherein the waveguide comprises an optical fiber having a flat face substantially perpendicular to an average direction of propagation of light within the optical fiber, the flat face is positioned above the surface to be examined to follow a direction making a substantial angle with the surface under conditions that no measurable constructive interference phenomenon occurs between the wave reflected by the surface and guided in return by the optical fiber, and a wave reflected in the optical fiber on the flat face.

8. The process of near field reflection microscopy according to claim 2, wherein the waveguide comprises an optical fiber having a flat face substantially perpendicular to an average direction of propagation of light within the optical fiber, the flat face is positioned above the surface to be examined to follow a direction substantially orthogonal to the surface, an appropriate index gel being inserted between the surface to be examined and said flat output surface of the fiber so that no measurable constructive interference phenomenon occurs between the wave reflected by the surface and guided in return by the optical fiber, and a wave reflected in the optical fiber on the flat face.

9. The process of near field reflection microscopy according to claim 2, wherein the optical fiber forms a monomode waveguide.

10. The process of near field reflection microscopy according to claim 1, comprising producing the highly coherent electromagnetic wave with a laser.

11. Near field reflection microscope capable of scanning a surface to be examined, comprising:

an optical probe comprising a waveguide having a flat face at a transparent first end and a second end;

means for vertically displacing said optical probe above a surface to be examined with a precision of less than a nanometer;

means for laterally displacing said optical probe above the surface to be examined with a precision of less than a nanometer;

a highly coherent electromagnetic wave source;

an electromagnetic wave detector; and means for coupling said second end of the waveguide to said highly coherent electromagnetic wave source and said electromagnetic wave detector, said means for coupling comprising a bidirectional optical coupler having two input transmission channels and at least one output transmission channel, one of said two input transmission channels of said coupler being connected to said highly coherent electromagnetic wave source, the other of said two input transmission channels being connected to said electromagnetic wave detector, and the at least one output transmission channel is connected to said waveguide.

12. The microscope according to claim 11, wherein the coupler has a second output transmission channel constructed and arranged to be capable of taking a reference measurement of intensity of a wave emitted by said highly coherent electromagnetic wave source.

13. The microscope according to claim 11, said electromagnetic wave detector is connected by a feedback system of said means for vertically displacing, said feedback system comprising a feed-back device and a microprocessor controlling a signal received from the electromagnetic wave detector and representing the intensity of the light being propagated in return to the coupler.

14. The microscope according to claim 11, wherein said waveguide comprises an optical fiber comprising an output transmission channel of said bidirectional optical coupler.

15. The microscope according to claim 11, wherein said waveguide comprises an optical fiber.

16. The microscope according to claim 14, wherein said flat face is substantially perpendicular to an average direction of propagation of light within said optical fiber.

17. The microscope according to claim 15, wherein said optical fiber is stretched at said first end to present a core having a diameter corresponding to a narrowest main propagation mode of an electromagnetic wave within said optical fiber.

18. The microscope according to claim 17, wherein said main propagation mode is affected by a wavelength of an electromagnetic wave emitted by said source, said transmission channels of said bidirectional optical coupler, and a numerical opening of said optical fiber.

19. The microscope according to claim 15, wherein said optical fiber comprises a cladding which is thinner at said first end of said optical fiber, and said flat face is substantially perpendicular to an average direction of propagation of light within said optical fiber.

20. The microscope according to claim 15, wherein said flat face is at an angle to an average direction of propagation of light within said optical fiber.

21. The process of near field reflection microscopy according to claim 2, wherein the waveguide comprises an optical fiber having a flat face making a substantial angle with an average direction of propagation of light within the optical fiber so that no measurable constructive interference phenomenon occurs between the wave reflected by the surface to be examined and guided in return by the optical fiber when the optical fiber is positioned above the surface to be examined in such a way that the average direction of the propagation of light in said optical fiber follows a direction substantially orthogonal to the surface.

22. The process of near field reflection microscopy according to claim 9, wherein the optical fiber is an optical step-index fiber.

* * * * *

UNITED STATES PATENT AND TRADEMARK OFFICE
CERTIFICATE OF CORRECTION

PATENT NO. : 5,340,981
DATED : August 23, 1994
INVENTOR(S) : F. DE FORNEL et al.

It is certified that error appears in the above-indentified patent and that said Letters Patent is hereby corrected as shown below:

In the drawings, add the drawing Sheet, consisting of FiGS. 5 and 6, as shown on the attached page.

At the cover page, line 1 under title of the printed patent, change "REAR" to ---NEAR---.

At the cover page, line 1 under assignee of the printed patent, change "STM" to ---SIM---.

At column 1, line 1 of the printed patent, change "REAR" to ---NEAR---.

At column 1, line 10 of the printed patent, change "fibre" to ---fiber---.

At column 1, between lines 10 and 11 of the printed patent, insert ----Background and Material Information---.

At column 1, line 14 of the printed patent, change "larger)than" to ---larger) than---.

At column 1, line 17 of the printed patent, change "wave length" to ---wavelength---.

At column 2, line 33 of the printed patent, change "Fibre-optic scanning differential interference contrast optical microscope" to ---Fibre-Optic Scanning Differential Interference Contrast Optical Microscope---.

At column 2, line 58 of the printed patent, change "expontential" to ---exponential---.

At column 2, line 60 of the printed patent, change "distance." to ---distance; and---.

At column 2, line 61 of the printed patent, change "Scanning" to ---scanning---.

At column 3, line 10 of the printed patent, change "enables to measure" to ---permits the measurement of---.

At column 3, line 14 of the printed patent, change "kinds, namely:" to ---kinds.---.

At column 3, line 15 of the printed patent, change "according" to ---According---.

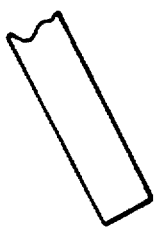
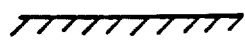
Fig_ 5
Fig_ 6

UNITED STATES PATENT AND TRADEMARK OFFICE
CERTIFICATE OF CORRECTION

PATENT NO. : 5,340,981
DATED : August 23, 1994
INVENTOR(S) : F. DE FORNEL et al.

It is certified that error appears in the above-indentified patent and that said Letters Patent is hereby corrected as shown below:

At column 3, line 28 of the printed patent, change "according" to ---According---.

At column 3, line 57 of the printed patent, change "fiber; it" to ---fiber as illustrated in Fig. 2; it---.

At column 4, line 35 of the printed patent, change "downward" to ---rising---.

At column 4, line 46 of the printed patent, change "fiber. This" to ---fiber as illustrated in Fig. 5. This---.

At column 4, line 62 of the printed patent, change "fiber. This" to ---fiber as illustrated in Fig. 6. This---.

At column 5, line 12 of the printed patent, change "invention realization," to ---invention.---

At column 5, line 27 of the printed patent, insert---Fig. 5 shows a fiber optic having a flat face which is substantially perpendicular to the longitudinal propagation axis of the fiber, with the flat face making a substantial angle with the surface to be studied; and
Fig. 6 shows a fiber optic having a flat face which makes a substantial angle with respect to the average direction of propagation of light in the fiber.--- .

At column 5, line 41 of the printed patent, change "including" to ---includes---.

At column 5, line 44 of the printed patent, change "that" to ---the fiber optic---.

At column 5, line 57 of the printed patent, change "to laterally scan" to ---lateral scanning---.

At column 7, line 40 of the printed patent, change "neighbourhood" to ---neighborhood---, At column 7, line 41 of the printed patent, change "wave length" to ---wavelength---.

UNITED STATES PATENT AND TRADEMARK OFFICE
CERTIFICATE OF CORRECTION

PATENT NO. : 5,340,981
DATED : August 23, 1994
INVENTOR(S) : F. DE FORNEL et al.

It is certified that error appears in the above-indentified patent and that said Letters Patent is hereby corrected as shown below:

At column 7, line 62 of the printed patent, change "$d_p$" to ---dp---.
At column 8, line 3 of the printed patent, change "$d_p$" to ---dp---.
At column 8, line 9 of the printed patent, change "$d_p$" to ---dp---.
At column 8, line 14 of the printed patent, change "$d_p$" to ---dp---.
At column 8, line 37 of the printed patent, change "no and n1" to ---$n_o$ and $n_1$---.
At column 10, line 43 of the printed patent, change "alone" to ---only---.
At column 10, line 56 of the printed patent, change "an" to ---a---.
At column 12, line 50 (claim 13, line 1) of the printed patent, insert ---wherein--- before "said".
At column 12, line 52 (claim 13, line 3) of the printed patent, change "of" to ---to---.

Signed and Sealed this

Eighteenth Day of April, 1995

BRUCE LEHMAN

Attest:

Attesting Officer

Commissioner of Patents and Trademarks